United States Patent
Randazzo

[19]

[11] Patent Number: 5,838,616
[45] Date of Patent: Nov. 17, 1998

[54] GATE EDGE ALIGNED EEPROM TRANSISTOR

[75] Inventor: Todd A. Randazzo, Colorado Springs, Colo.

[73] Assignee: Symbios, Inc., Fort Collins, Colo.

[21] Appl. No.: 723,327

[22] Filed: Sep. 30, 1996

[51] Int. Cl.$^6$ .......................... H01L 29/788; G11C 13/00
[52] U.S. Cl. .................... 365/185.14; 365/185.1; 365/185.26; 365/185.28; 257/321; 257/316
[58] Field of Search ..................... 257/300, 231, 257/322, 315, 316; 365/185.26, 185.01, 185.14, 185.1, 185.28

[56] References Cited

U.S. PATENT DOCUMENTS

| | | | |
|---|---|---|---|
| 4,132,904 | 1/1979 | Harari | 307/238 |
| 4,663,645 | 5/1987 | Komori et al. | 357/23.5 |
| 4,775,642 | 10/1988 | Chang et al. | 437/44 |
| 4,788,663 | 11/1988 | Tanaka et al. | 365/185 |
| 4,918,501 | 4/1990 | Komori et al. | 357/23.5 |
| 4,935,802 | 6/1990 | Noguchi et al. | 357/54 |
| 4,972,371 | 11/1990 | Komori et al. | 365/185 |
| 5,065,362 | 11/1991 | Herdt et al. | 365/154 |
| 5,095,344 | 3/1992 | Harari | 357/23.5 |
| 5,098,855 | 3/1992 | Komori et al. | 437/52 |
| 5,153,144 | 10/1992 | Komori et al. | 437/43 |
| 5,172,200 | 12/1992 | Muragishi et al. | 257/315 |
| 5,172,338 | 12/1992 | Mehrotra et al. | 365/185 |
| 5,189,640 | 2/1993 | Hurard | 365/154 |
| 5,194,924 | 3/1993 | Komori | 257/316 |
| 5,220,533 | 6/1993 | Turner | 365/218 |
| 5,241,498 | 8/1993 | Yokokura | 365/185 |
| 5,267,209 | 11/1993 | Yoshida | 365/218 |
| 5,278,794 | 1/1994 | Tanaka et al. | 365/200 |
| 5,280,446 | 1/1994 | Ma et al. | 365/185 |
| 5,283,759 | 2/1994 | Smith | 365/185 |
| 5,299,162 | 3/1994 | Kim et al. | 365/201 |
| 5,352,620 | 10/1994 | Komori et al. | 437/52 |
| 5,353,248 | 10/1994 | Gupta | 365/154 |
| 5,355,007 | 10/1994 | Smayling | 257/231 |
| 5,361,224 | 11/1994 | Takasu | 365/145 |
| 5,373,465 | 12/1994 | Chen et al. | 365/185 |
| 5,386,422 | 1/1995 | Endoh et al. | 371/21.5 |
| 5,399,917 | 3/1995 | Allen et al. | 327/436 |
| 5,412,238 | 5/1995 | Chang | 257/321 |
| 5,453,388 | 9/1995 | Chen et al. | 437/30 |
| 5,455,790 | 10/1995 | Hart et al. | 365/185.11 |
| 5,460,998 | 10/1995 | Liu | 437/57 |
| 5,552,621 | 9/1996 | Kowalski | 257/321 |
| 5,661,687 | 8/1997 | Randazzo | 365/185.24 |

*Primary Examiner*—Viet Q. Nguyen
*Attorney, Agent, or Firm*—Wayne P. Bailey; John R. Ley

[57] ABSTRACT

An electrically-erasable electrically-programmable read only memory (EEPROM) transistor is programmed and erased by electron tunneling and reduces gate induced drain leakage. The EEPROM transistor comprises a semiconductor substrate having source and drain regions disposed horizontally apart. A floating gate conductor is vertically adjacent to and spaced from the source and drain regions. An insulation layer is disposed between the floating gate conductor and the source and drain regions. A first segment of the insulation layer, which is between the drain region and a minor portion of the floating gate conductor, has a first thickness. A second segment of the insulation layer which is adjacent to the first layer and the remainder on the floating gate conductor, has a second thickness which is substantially greater than the first thickness. A low density diffusion area is defined within a segment of the semiconductor substrate which extends from the drain region, encompasses the first segment of the insulation layer, to underneath a portion of the second segment of the insulation layer.

23 Claims, 4 Drawing Sheets

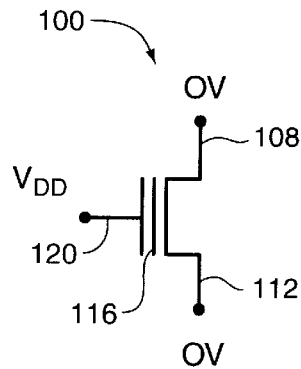
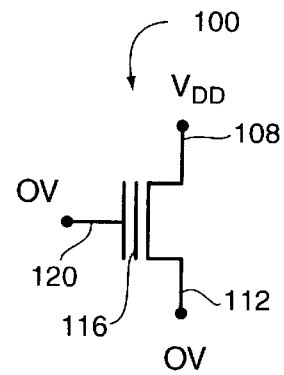
FIG. 4    FIG. 5
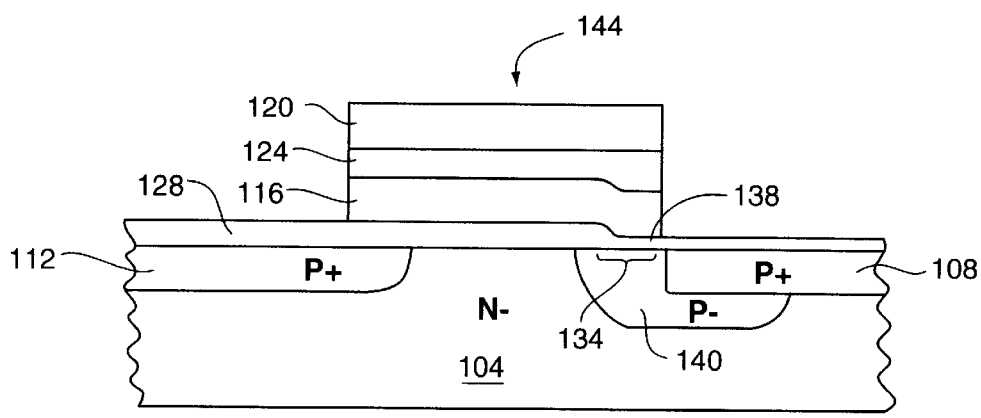
FIG. 6
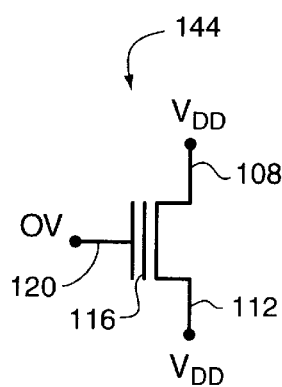
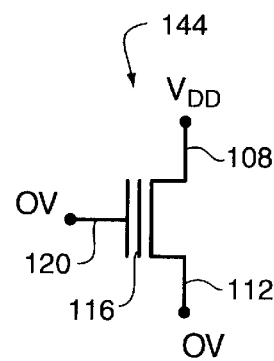
FIG. 7    FIG. 8

GATE EDGE ALIGNED EEPROM TRANSISTOR

FIELD OF THE INVENTION

This invention relates to an electrically-erasable programmable read only memory (EEPROM) cell and, in particular, to an EEPROM cell which includes a thin oxide window between its floating gate and its drain to enable programming and erasure by electron tunneling and which further includes a low density diffusion region which extends from the drain to beyond the thin oxide window to reduce any gate induced drain leakage.

BACKGROUND OF THE INVENTION

A conventional floating gate transistor 10 which is used in an electrically-programmable electrically-erasable read only memory (EEPROM) cell is shown in FIG. 1. The transistor 10 includes a semiconductor substrate 14 with a drain region 18 and a source region 22 defined therein, a floating gate 26, and a control gate 30. A thick insulating film 34 is interposed between, and electrically insulates, the floating gate 26 from the control gate 30. Another thick insulating film 38 is interposed between, and electrically insulates, the floating gate 26 from the drain 18 and the source 22. The insulating film 38 has a reduced thickness region that overlies a central portion of the drain 18 to form a tunnel window 40 through which electrons can tunnel between the drain 18 and the floating gate 26.

The floating gate 26 accumulates electrical charge which increases the threshold voltage which must be supplied to the control gate 30 to generate conduction in a channel region 42 between the drain 18 and the source 22. The amount of electrical charge in the floating gate 26 and, correspondingly, the magnitude of the threshold voltage, defines a binary memory state which may be represented by the transistor 10. A first memory state is represented when the threshold voltage is less than or equal to a predetermined maximum and an opposite second memory state is represented when the threshold voltage exceeds the predetermined voltage.

The transistor 10 is programmed from the first memory state to the second memory state by applying a predetermined programming voltage between the control gate 30 and the drain 18 to increase the threshold voltage to at least the level of the threshold magnitude. In response to the programming voltage, electrons tunnel from the drain 18 through the tunnel window 40 to the floating gate 26 to increase sufficiently the charge in the floating gate 26. In contrast, the transistor 10 is erased from the second memory state to the first memory state by applying a predetermined erasure voltage between the drain 18 and the control gate 30 to cause electron tunneling from the floating gate 26 through the tunnel window 40 to the drain 18 and, correspondingly, to decrease the threshold voltage to less than the threshold magnitude.

Conventionally, integration density of semiconductor devices has been increased by miniaturizing the structure of the devices. In a metal-oxide-semiconductor type field effect transistor (MOSFET), as the channel length is shortened and the insulating film 38 is thinned, the electric field increasingly concentrates near the drain 18, which is well known in the art. The concentration of the electrical field over the junction between the drain 18 and the substrate 14 reduces the voltage level which can be applied to the drain 18 before electron tunneling occurs between the drain 18 and the floating gate 26, causing a corresponding change in the threshold voltage of the transistor 10 which is known as gate induced drain leakage. Consequently, the memory state of the transistor 10 can be erroneously changed when a range of voltages which are associated with the normal operation of the transistor 10 are supplied to the drain 18.

It is with respect to this and other background information that the present invention has evolved.

SUMMARY OF THE INVENTION

The electrically-erasable electrically-programmable read only memory (EEPROM) transistor of the present invention offers significant improvements in achieving programming and erasure by electron tunneling while reducing any gate induced drain leakage.

In accordance with this and other aspects, the EEPROM transistor comprises a semiconductor substrate with source and drain regions disposed therein a predetermined distance apart. A floating gate conductor is adjacent to the source and drain regions. An insulation layer is disposed between the floating gate conductor and the source and drain regions. A first segment of the insulation layer, which is between the drain region and the floating gate conductor, has a first predetermined thickness. A second segment of the insulation layer, which is adjacent to the first segment, has a second predetermined thickness which is substantially greater than the first thickness. A low density diffusion area is defined within a segment of the semiconductor substrate which extends from the drain region, underneath the first segment of the insulation layer, to underneath a portion of the second segment of the insulation layer.

Electrons tunnel between the drain region and the floating gate through the first segment of the insulation layer to program and erase the EEPROM transistor. The low density diffusion area reduces any gate induced drain leakage in the tunnel-programmed tunnel-erased EEPROM transistor.

According to further aspects of the present invention, an edge of the drain region is substantially aligned with an edge of the floating gate conductor to further reduce any gate induced drain leakage in the EEPROM transistor. The drain region comprises a high impurity dopant concentration while the low density diffusion area comprises an impurity dopant concentration which is sufficiently lower than the impurity concentration of the drain region to prevent a substantial threshold voltage variation when voltages which are less than the erasure voltage are supplied to the drain region. During a read operation of the transistor, the low density diffusion area also reduces the generation of hot carriers to prevent a soft write.

A more complete appreciation of the present invention and its scope can be obtained by reference to the accompanying drawings, which are briefly summarized below, the following detailed description of presently preferred embodiments of the invention, and the appended claims.

BRIEF DESCRIPTION OF THE DRAWINGS

FIG. 4 is a schematic diagram of the EEPROM transistor shown in FIG. 2 showing voltage signals which cause programming of the transistor.

FIG. 5 is a schematic diagram of the EEPROM transistor shown in FIG. 2 showing voltage signals which cause erasure of the transistor.

FIG. 6 is a cross-section view of another embodiment of the EEPROM transistor of the present invention which is an alternate to the EEPROM transistor shown in FIG. 2.

FIG. 7 is a schematic diagram of the EEPROM transistor shown in FIG. 6 showing voltage signals which cause programming of the transistor.

FIG. 8 is a schematic diagram of the EEPROM transistor shown in FIG. 6 showing voltage signals which cause erasure of the transistor.

DETAILED DESCRIPTION

Figure 2:
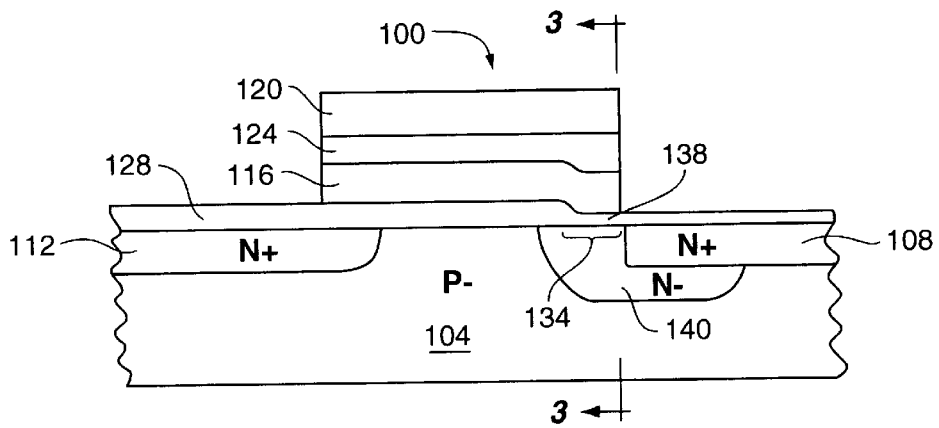
FIGS. 2 and 3 are cross-section views of an EEPROM transistor incorporating the present invention, with FIG. 2 being taken along section line 2—2 of FIG. 3 and with FIG. 3 being taken along section line 3—3 of FIG. 2.
Figure 3:
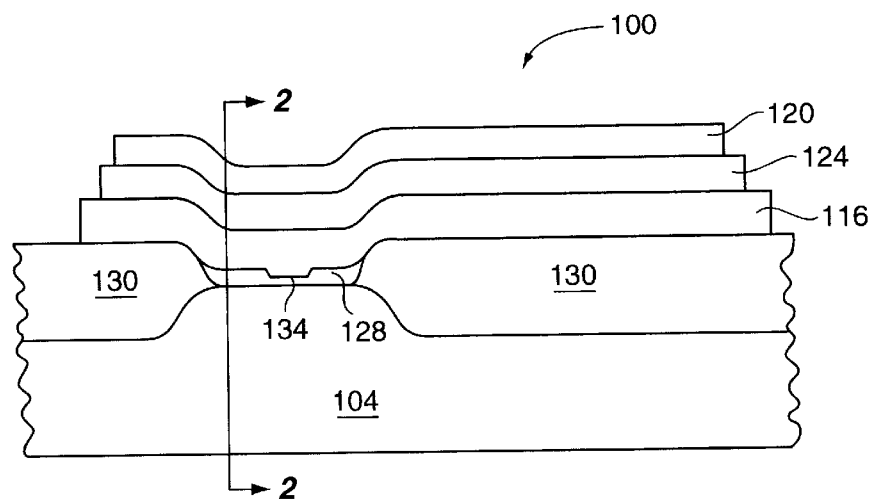
Figure 9:
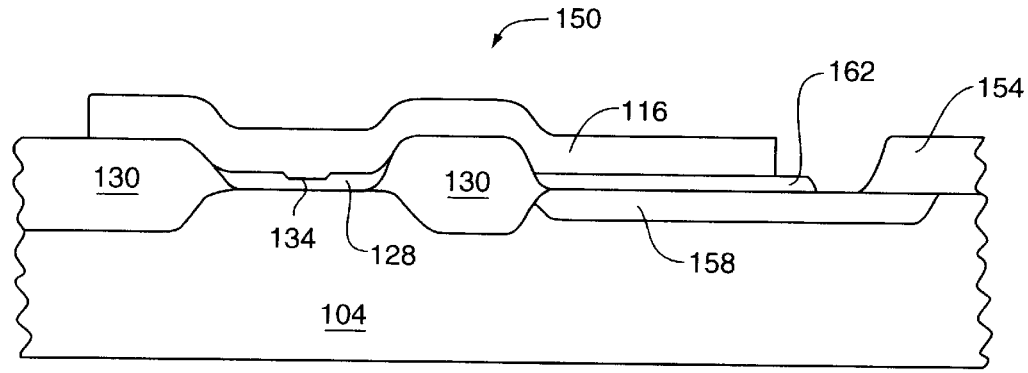
FIG. 9 is a cross-section view of another embodiment of the EEPROM transistor of the present invention, which is an alternate to the EEPROM transistor shown in FIG. 2.
Figure 10:
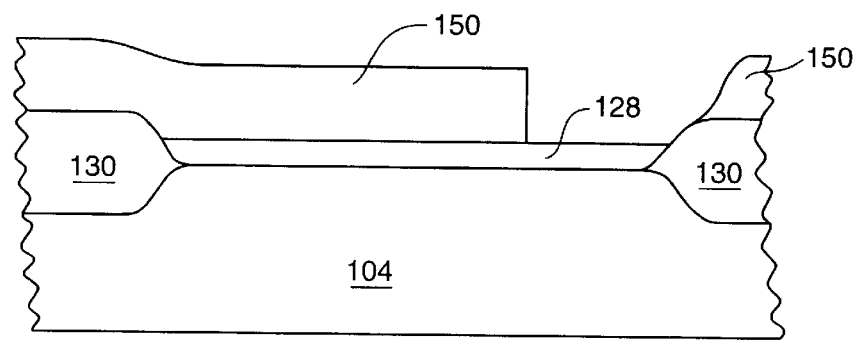
FIGS. 10–14 are cross-sectional illustrations showing steps for fabricating the EEPROM transistor shown in FIG. 2.

An EEPROM transistor 100 according to one embodiment of the present invention is shown in FIGS. 2 and 3. The transistor 100 includes a p-type silicon substrate 104 with a drain region 108 and a source region 112 defined therein, a floating gate 116, and a control gate 120. The drain 108 and source 112 are each doped with a high concentration of N+ type impurities. The floating gate 116 and the control gate 120 are formed of polycrystalline silicon or metal. The control gate 120 overlies the floating gate 116 with a thick insulating film 124, such as a silicon oxide film, interposed therebetween to capacitively couple the floating gate 116 to the control gate 120. The floating gate 116 overlies a segment of the substrate 104 with another thick insulating film 128, such as a thin film of silicon oxide, interposed therebetween to capacitively couple the floating gate 116 to the drain and source regions 108 and 112. The transistor 100 is electrically isolated from any adjacent circuitry in the substrate 104 by an electrically insulating segment 130, such as silicon oxide, which is defined in the substrate 104. The thick insulating film 128 has a substantially reduced thickness in a region adjacent to the drain 108 to form a thin oxide window 134.

Voltage signals which cause programming of the transistor 100 (FIGS. 2 and 3) which are shown in FIG. 4 in relation to a schematic illustration of the transistor. When 0 volts is supplied to the drain and source regions, 108 and 112, and a positive voltage (VDD) is supplied to the control gate 120, the electric field concentrates along the edges of the floating gate 116 and over a relatively small area of the thin oxide window 134 adjacent to the drain 108, as shown in FIG. 2. The thin oxide window 134 is sufficiently thin so that when the VDD signal (FIG. 4) is raised to a predetermined programming voltage, a sufficient quantity of electrons tunnel from the drain 108, through a thin segment 138 at the thin oxide window 134 between the adjacent edges of the drain 108 and the floating gate 116, to the floating gate 116 to raise the threshold voltage of the transistor 100 above a predetermined threshold (i.e. the transistor is "gate programmed"). The programming voltage is about 1.5 to about 5 times greater than a range of normal operating voltages for which programming of the transistor 100 is not desired. The thin segment 138 of the oxide window 134 has a thickness of less than about 120 Angstroms.

In addition to enabling gate programming, the thin oxide window 134 also encourages erasure of the programmed threshold voltage. Erasure occurs by electron tunneling from the floating gate 116 to the drain 108 when voltage signals are supplied as shown in FIG. 5 to the transistor 100, which is known as gate induced drain leakage. Such erasure is undesirable in EEPROM transistor circuits which require the threshold voltage to remain substantially unchanged when voltages less than an erasure voltage are supplied to the drain region. Preferably, with the present invention, the erasure voltage is about 1.5 to about 5 times greater than the range of normal operating voltages for which erasure of the transistor 100 is not desired. For example, a transistor which is gate programmable by tunneling electrons and which minimizes any gate induced drain leakage, in response to normal operating voltages less than an erasure voltage, can advantageously be used in the non-volatile memory transistor which is disclosed in my U.S. patent application entitled "Non-Volatile Memory Which is Programmable From a Power Source", Ser. No. (Docket No. 95-080), filed Jun. 28, 1996, which is assigned to the Assignee hereof.

To minimize any gate induced drain leakage, an edge of the drain 108 is substantially aligned with an edge of the floating gate 116, and a low density diffusion (LDD) area 140 which is defined in the substrate 104 is employed, as shown in FIG. 2. Alignment of the edges between the drain 108 and the floating gate 116 reduces any leakage of electrons from the floating gate 116 to the drain 108 due to the concentrated electric field along the edges of the floating gate 116, while still enabling electron tunneling between the drain 108 and the floating gate 116 when predetermined programming or erasure voltages are supplied to the transistor 100.

The junction between the n-type drain 108 and the p-type substrate 104 (i.e. the p-n junction) causes the thin oxide window 134 in the region adjacent to the p-n junction to break down, allowing electron tunneling, at a lower electrical field than elsewhere in the thin oxide window 134. Consequently, if the p-n junction was positioned underneath, or immediately adjacent to, the thin oxide window 134 it would substantially increase the amount of gate induced drain leakage. To avoid positioning the p-n junction underneath the thin oxide window 134, the LDD area 140 extends from the drain 108 beyond the thin oxide window 134 to underneath the thicker portion of the thick insulating film 128. The LDD area 140 has an impurity concentration of less than about $1 \times 10^{14}$ ions/cm$^2$. In this manner, the p-n junction between the drain 108 and the substrate 104 is removed from underneath, or immediately adjacent to, the thin oxide window 134. A larger magnitude voltage can be supplied to the drain 108 before the p-n junction between the drain 108 and the substrate 104 breaks down, thereby enabling erasure of the transistor 100. The LDD area 140 also inhibits the generation of hot carriers to prevent a soft write of the transistor 100.

FIG. 6 shows another transistor 144 of the present invention which has a similar structure to the transistor 100 (FIGS. 2 and 3) but, in contrast, has opposite types of doped impurities. In particular, transistor 144 includes an N-type substrate 104, a P+ type source 108 and drain 112, and a low impurity concentration P– type LDD area 140.

The transistor 144 is tunnel programmed when the programming voltage level is supplied to the drain and source regions, 108 and 112, as shown in FIG. 7. The electric field concentrates along the edges of the floating gate 116 and induces a substantial increase in the threshold voltage of the transistor 140, as shown in FIG. 6. The transistor 144 is erased when the erasure voltage level is supplied to the drain 108 and the control gate 120, as shown in FIG. 8. A sufficient number of electrons tunnel between the floating gate 116 and the drain 108 to substantially lower the threshold voltage of the transistor 140, as shown in FIG. 6. In contrast, when the voltage level supplied to the drain 108, as shown in FIG. 8, is less than the erasure voltage, the LDD area 140 substantially increases the voltage which can be supplied to the drain 108 before the p-n junction between the drain 108 and the substrate 104 breaks down, thereby causing erasure of the transistor 144. The transistor 144 is gate programmable, drain erasable, and avoids gate induced drain leakage, in the same manner as transistor 100 (FIG. 2).

Another transistor 150 of the present invention has a similar structure to the transistor 100 shown in FIG. 3 but, in contrast, has a control gate 154 which is adjacent to, but not overlying, the floating gate 116. The floating gate 116 overlies a conductive channel 158 which is defined in the substrate 104. A thick insulating film 162, such as a silicon oxide film, is interposed between the floating gate 116 and the conductive channel 158. The conductive channel 158 is electrically connected to the control gate 154. Consequently, the floating gate 116 is capacitively coupled to the adjacent control gate 154. The thin oxide window 134 is positioned adjacent to the drain region 108 with the underlying LDD area 140, the same as shown in FIG. 2, to enable electron tunneling for programming and erasing the transistor 150 while minimizing any gate induced drain leakage.

Figure 1:
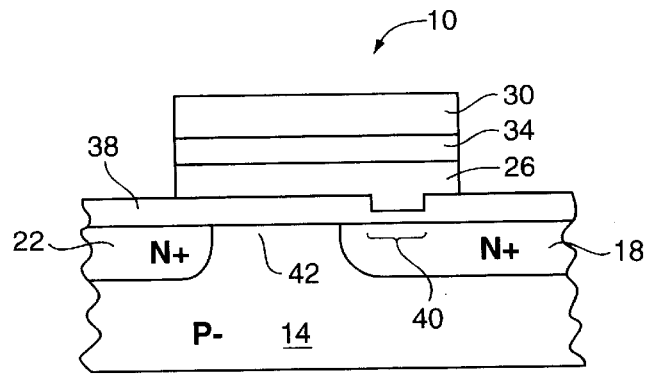
FIG. 1 is a cross-section view illustrating a prior art EEPROM transistor.
Figure 11:
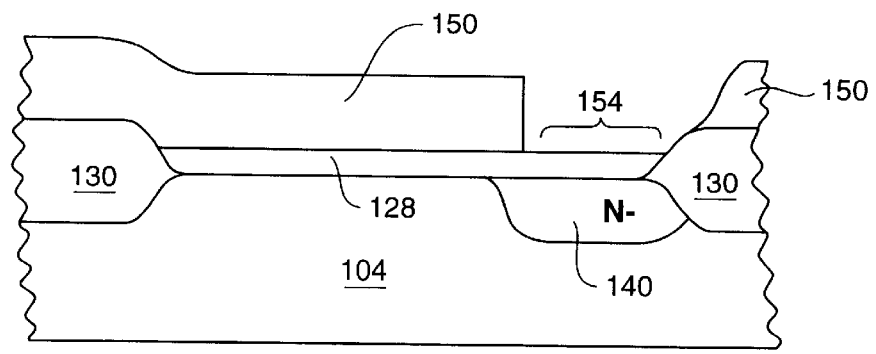

The steps for fabricating the EEPROM transistor 100 (FIG. 1) are illustrated in the sequential cross-section views shown in FIGS. 10–14. Initially, the P type substrate 104, which consists of single crystal silicon, is prepared. The insulating film 128, which comprises silicon oxide and has a thickness at locations other than at the thin oxide window 134 of between about 1.5 to 5 times the desired thickness at the thin oxide window 134 (FIG. 2), is either thermally grown or deposited by a chemical vapor deposition process. A photoresist layer 150 is then deposited and patterned by conventional means to expose a segment 154 of the insulating film 128 as shown in FIG. 11.

Figure 12:
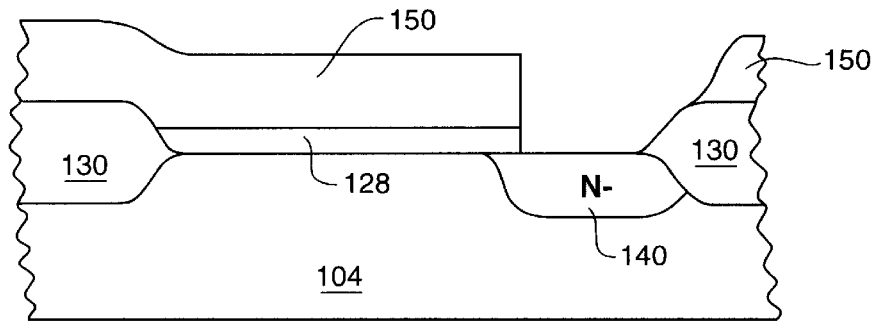
Figure 13:
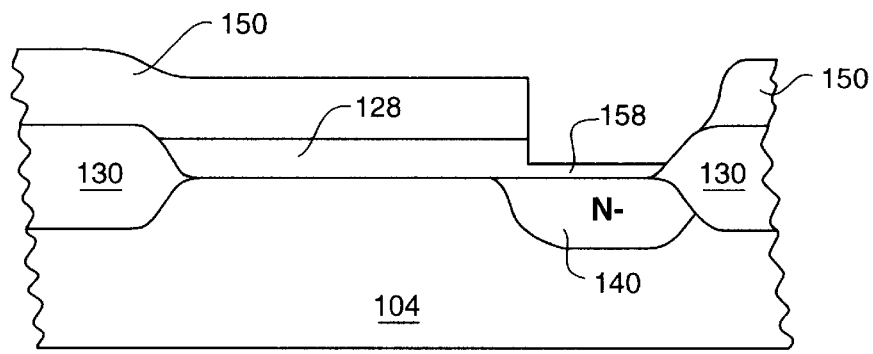

Next, the LDD area 140 is formed by ion implantation using the photoresist layer 150 to pattern the LDD area 140 as shown in FIG. 11. The exposed segment 154 of the insulating film 128 is then removed using a conventional chemical etching process, as shown in FIG. 12. Another insulating film 158, which comprises silicon oxide and has a thickness equal to the desired thickness of the insulating film 128 at the thin oxide window 134 (FIG. 2), is either thermally grown or deposited by a chemical vapor deposition process on top of the insulating film 128 and the exposed LDD area 140, as shown in FIG. 13.

Figure 14:
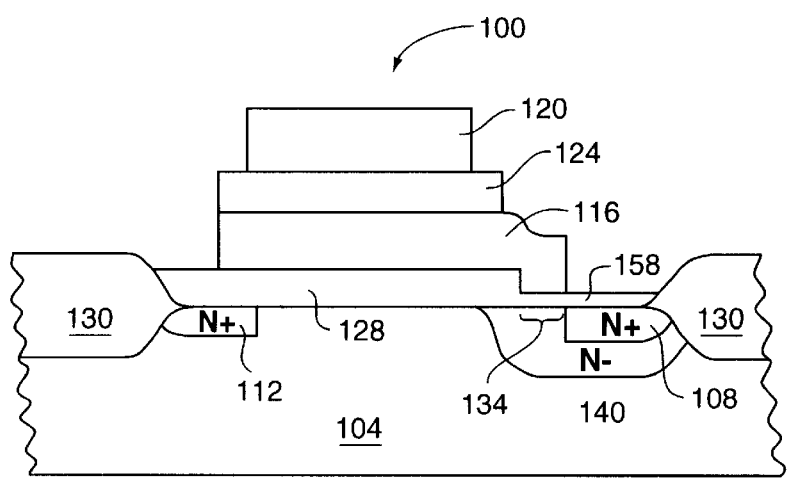

Next, The floating gate 116 is deposited and patterned to overlie a segment of the insulating films 128 and 158, as shown in FIG. 14. The drain region 108 and the source region 112 are then formed by a conventional impurity doping process. The thin insulating film 158 causes the drain region 108 to be substantially aligned (vertically, as shown) with the edge of the floating gate 116. The insulating film 124 and the control gate are then deposited by conventional chemical vapor deposition processes on top of the floating gate 116 to complete the transistor 100 shown in FIG. 14.

Through these fabrication steps, the drain region 108 and the floating gate 116 are edge-aligned with the insulating film at the thin oxide window 134 positioned therebetween to enable programming and erasure by electron tunneling. Additionally, the LDD area 140 is formed to extend from the drain region 108 to beyond the thin oxide window 134 to prevent electron tunneling between the floating gate 116 and the drain region 108 when voltage levels which are less than a predetermined programming or erasure voltage are supplied to the drain region 108. Consequently, the transistor 100 is programmed and erased by tunneling electrons and has substantially reduced gate induced drain leakage.

A presently preferred embodiment of the invention and its improvements have been described with a degree of particularity. This description has been made by way of preferred example. It should be understood that the scope of the present invention is defined by the following claims, and should not necessarily be limited by the detailed description of the preferred embodiment set forth above.

The invention claimed is:

1. An electrically-erasable electrically-programmable read only memory (EEPROM) transistor comprising:

a semiconductor substrate;

source and drain regions disposed in a horizontal spaced apart relationship in the semiconductor substrate, the drain region having an edge;

a floating gate conductor vertically spaced from the source and drain regions and having an outside edge which is substantially vertically aligned with the edge of the drain region; and an insulation layer disposed vertically between the floating gate conductor and the source and drain regions, the insulation layer having first and second segments, the first segment extending between the drain region and the floating gate conductor and having a first thickness, the second segment extending from the first segment and having a second thickness which is substantially greater than the first thickness.

2. An EEPROM transistor as defined in claim 1 wherein:

the first thickness is sufficient for electrons to tunnel between the drain region and the floating gate conductor to cause a substantial threshold voltage variation when a predetermined programming voltage level is supplied to the drain region.

3. An EEPROM transistor as defined in claim 2 wherein:

the second thickness is about 2 to about 5 times thicker than the first thickness.

4. An EEPROM transistor as defined in claim 1 further comprising:

a low density diffusion area, defined within the semiconductor substrate in a location which extends from a portion of the drain region encompassing the edge of the drain region and underneath the first segment and underneath a portion of the second segment.

5. An EEPROM transistor as defined in claim 4 wherein:

the drain region has a high impurity dopant concentration; and the low density diffusion area has an impurity dopant concentration which is sufficiently lower than the impurity concentration of the drain region to prevent a substantial threshold voltage variation when voltages which are less than a predetermined erasure voltage level are supplied to the drain region.

6. An EEPROM transistor as defined in claim 5 wherein:

the low density diffusion area has an impurity concentration of less than about $1 \times 10^{14}$ ions/cm$^2$.

7. An electrically-erasable electrically-programmable read only memory (EEPROM) transistor comprising:

a semiconductor substrate;

source and drain regions disposed horizontally apart in the semiconductor substrate;

a floating gate conductor vertically spaced from and adjacent to the source and drain regions;

an insulation layer vertically disposed between the floating gate conductor and the source and drain regions, the insulation layer having first and second segments, the first segment extending between the drain region and a minor portion of the floating gate conductor and having a first thickness, the second segment extending from the first segment and under a major portion of the floating gate conductor, the second segment having a second thickness which is substantially greater than the first thickness; and a low density diffusion area, defined within the semiconductor substrate which extends from the drain region, adjacent to the entire first segment, and underneath a portion of the second segment.

8. An EEPROM transistor as defined in claim 7 wherein:

an edge of the drain region is substantially vertically aligned with an edge of the floating gate conductor.

9. An EEPROM transistor as defined in claim 7 wherein:

the first thickness of the first segment is sufficient for electrons to tunnel between the drain region and the floating gate conductor to cause a substantial threshold voltage variation when a predetermined programming voltage level is supplied to the drain region.

10. An EEPROM transistor as defined in claim 8 wherein:

the predetermined programming voltage is at least 1.5 times greater than a normal range of operating voltages of the EEPROM transistor.

11. An EEPROM transistor as defined in claim 8 wherein:

the predetermined programming voltage is within the range of about 1.5 to about 5 times greater than a normal range of operating voltages of the EEPROM transistor.

12. An EEPROM transistor as defined in claim 7 wherein:

the first thickness is less than about 120 Angstroms.

13. An EEPROM transistor as defined in claim 7 wherein:

the second thickness is about 1.5 to about 5 times thicker than the first thickness.

14. An EEPROM transistor as defined in claim 7 wherein:

the drain region comprises a high impurity dopant concentration; and the low density diffusion area has an impurity dopant concentration which is sufficiently lower than the impurity concentration of the drain region to prevent a substantial variation in threshold voltage when voltages which are less than a predetermined erasure voltage level are supplied to the drain region.

15. An EEPROM transistor as defined in claim 7 wherein:

the low density diffusion area has an impurity concentration of less than about $1 \times 10^{14}$ ions/cm$^2$.

16. An EEPROM transistor as defined in claim 7 wherein:

the semiconductor substrate comprises a P− type impurity dopant;

the source and drain regions each comprise an N+ type impurity dopant; and the low density diffusion area comprises an N− type impurity dopant.

17. An EEPROM transistor as defined in claim 7 wherein:

the semiconductor substrate comprises an N− type impurity dopant;

the source and drain regions each comprise a P+ type impurity dopant; and the low density diffusion area comprises a P− type impurity dopant.

18. The EEPROM transistor as defined in claim 7, wherein the low density diffusion area extends at least partially under the drain region.

19. A method for fabricating the EEPROM transistor as defined in claim 1, comprising the steps of:

forming the insulating layer over at least a portion of the semiconductor substrate;

forming a photoresist layer over at least a portion of the insulating layer;

ion implanting through an exposed portion of the insulating layer not covered by the photoresist layer to form an LDD area thereunder;

removing the exposed portion of the insulating layer;

forming the first segment over at least a portion of the LDD area;

forming the floating gate conductor over at least a portion of the first and second segments; and forming a drain region under at least a portion of the first segment.

20. A method, comprising the steps of:

forming an insulating layer over at least a portion of a substrate;

forming a photoresist layer over at least a portion of the insulating layer;

ion implanting through an exposed portion of the insulating layer not covered by the photoresist layer to form an LDD area thereunder;

removing the exposed portion of the insulating layer;

forming a thin insulating layer over at least a portion of the LDD area;

forming a floating gate over at least a portion of the insulating layer and over a portion of the thin insulating layer; and forming a drain region under at least a portion of the thin insulating layer.

21. The method of claim 20, wherein the drain region has an edge substantially aligned with an edge of the floating gate.

22. A method, comprising the steps of:

forming an LDD region under an insulating layer;

removing a portion of the insulating layer above the LDD region;

forming a thin insulating layer over a portion of the LDD region; and using a gate as a mask when forming a drain region between the thin insulating layer and the LDD region, wherein the gate has an edge that is substantially aligned with an edge of the drain region.

23. A method, comprising the steps of:

applying an insulating film to a substrate;

applying and patterning a photoresist layer over the insulating film to expose a portion of the insulating film;

implanting ions through the exposed portion of the insulating film to form an LDD area;

removing the exposed portion of the insulating film;

applying a thin film over at least a portion of the LDD area;

forming a gate over at least a portion of both the insulating film and thin insulating film; and implanting dopant through the thin insulating film to form a drain region having an edge that is substantially aligned with an edge of the gate.

* * * * *